United States Patent [19]

Yanai et al.

[11] Patent Number: 5,255,270
[45] Date of Patent: Oct. 19, 1993

[54] METHOD OF ASSURING DATA WRITE INTEGRITY ON A DATA STORAGE DEVICE

[75] Inventors: Moshe Yanai, Framingham; Natan Vishlitzky, Brookline; Bruno Altersecu, Newton; Daniel Castel, Framingham, all of Mass.

[73] Assignee: EMC Corporation, Hopkinton, Mass.

[21] Appl. No.: 610,425

[22] Filed: Nov. 7, 1990

[51] Int. Cl.⁵ .................. G06F 11/10; G11B 5/09
[52] U.S. Cl. .................. 371/10.2; 371/40.1; 371/68.1; 369/54; 369/58; 360/53
[58] Field of Search ............. 365/201; 369/54, 58; 371/40.1, 10.2, 40.1, 68, 54, 58, 53

[56] References Cited

U.S. PATENT DOCUMENTS

| | | | |
|---|---|---|---|
| 4,433,387 | 2/1984 | Dyer et al. | 364/900 |
| 4,558,446 | 12/1985 | Banba et al. | 371/10.2 |
| 4,604,748 | 8/1986 | Sato | 371/40.1 |
| 4,682,305 | 7/1987 | Ishikawa | 364/900 |
| 4,833,665 | 5/1989 | Tokumitsu et al. | 369/58 |
| 4,835,757 | 5/1989 | Ahiko | 369/54 |
| 4,888,691 | 12/1989 | George et al. | 364/300 |
| 4,924,327 | 5/1990 | Seamons et al. | 360/48 |
| 4,924,330 | 5/1990 | Seamons et al. | 360/66 |

OTHER PUBLICATIONS

IBM 3390 Disk Technology, © 1990 Computer Technology Research Corp., in its entirety (full text may be found in copending U.S. Appln. No. 07/586,796, filed Sept. 24, 1990, our file EMC-103XX).

IBM 3880 Storage Control Models 1,2,3 and 4 Description Manual, IBM Publication Number GA26-1661-9, © 1987 IBM Corporation, in its entirety (full text may be found in copending U.S. Appln. 07/586,796, filed Sep. 24, 1990, our file EMC-103XX).

Primary Examiner—Eugene R. LaRoche
Assistant Examiner—Viet Q. Nguyen
Attorney, Agent, or Firm—Daniel J. Bourque; Anthony M. Davis; Michael J. Bujold

[57] ABSTRACT

A method for assuring data write integrity on a data storage device includes storing data in a temporary memory storage medium after receipt of the data and prior to writing the data to a storage device. After the data is written to a storage device, the data itself, or an error checking and correction code is read and compared with the original data or with the data error checking and correction code. If no error occurs, new data is received written, read and compared. If an error has occurred, the method re-writes the data to the same or a re-assigned location on the data storage device prior to writing, reading and comparing the data again. Thus, data is written and compared prior to removing the data from a temporary memory storage medium to assure data write integrity.

19 Claims, 2 Drawing Sheets

METHOD OF ASSURING DATA WRITE INTEGRITY ON A DATA STORAGE DEVICE

FIELD OF THE INVENTION

This invention relates to computer systems and more particularly, to data storage systems.

BACKGROUND OF THE INVENTION

Data storage devices such as disk drives are generally considered acceptable and usable even though they include one or more defective data storage locations. Such defective data storage locations, normally referred to as defective blocks, are usually identified during a disk format operation, wherein the defective blocks are identified and set aside not to be utilized, and an index or pointer is provided to the next good block of data storage locations.

A problem arises, however, when one or more data storage locations within a good block become defective after disk formatting. Most importantly, this problem will not manifest itself until a data read operation is attempted. At that time, the corrupt data is discovered, and generally, the uncorrupted data is irretrievably lost.

SUMMARY OF THE INVENTION

Accordingly, the present invention features a method for assuring integrity of data written to a data storage medium and includes the steps of receiving a quantity of data to be written to a storage device and storing the data in at least one temporary memory storage medium. The data is then written to at least one data storage device while the data is also retained in at least one temporary memory storage medium.

The same data, an error checking and correction (ECC) code generated from the data, or other chosen criteria is then read from the data storage device and compared to the data stored in the memory storage medium or to the data's error checking and correction code. If the data or the ECC code previously written and now read from the data storage device is equivalent to the data's ECC code or to the data stored in the temporary memory storage medium, the system returns to the step of receiving new data to be written to a storage device thus assuring data write integrity.

If the data, data ECC code, or other chosen criteria read from the data storage device is not equivalent to the corresponding original data, ECC code, or chosen criteria which was stored in the temporary memory storage medium, the method determines that at least one selected storage location on the data storage device is defective and writes the data to a new storage location on the at least one data storage device. Alternatively, the method may attempt to re-write the data to the same data storage locations. Subsequently, the method of the present invention returns to the step of reading the data written to the data storage device and comparing the data which has been read with the data or the data's ECC code stored in the temporary memory storage medium.

DESCRIPTION OF THE DRAWINGS

These, and other features of the present invention will be better understood by reading the following detailed description taken together with the drawings wherein.

DETAILED DESCRIPTION OF THE INVENTION

Figure 1:
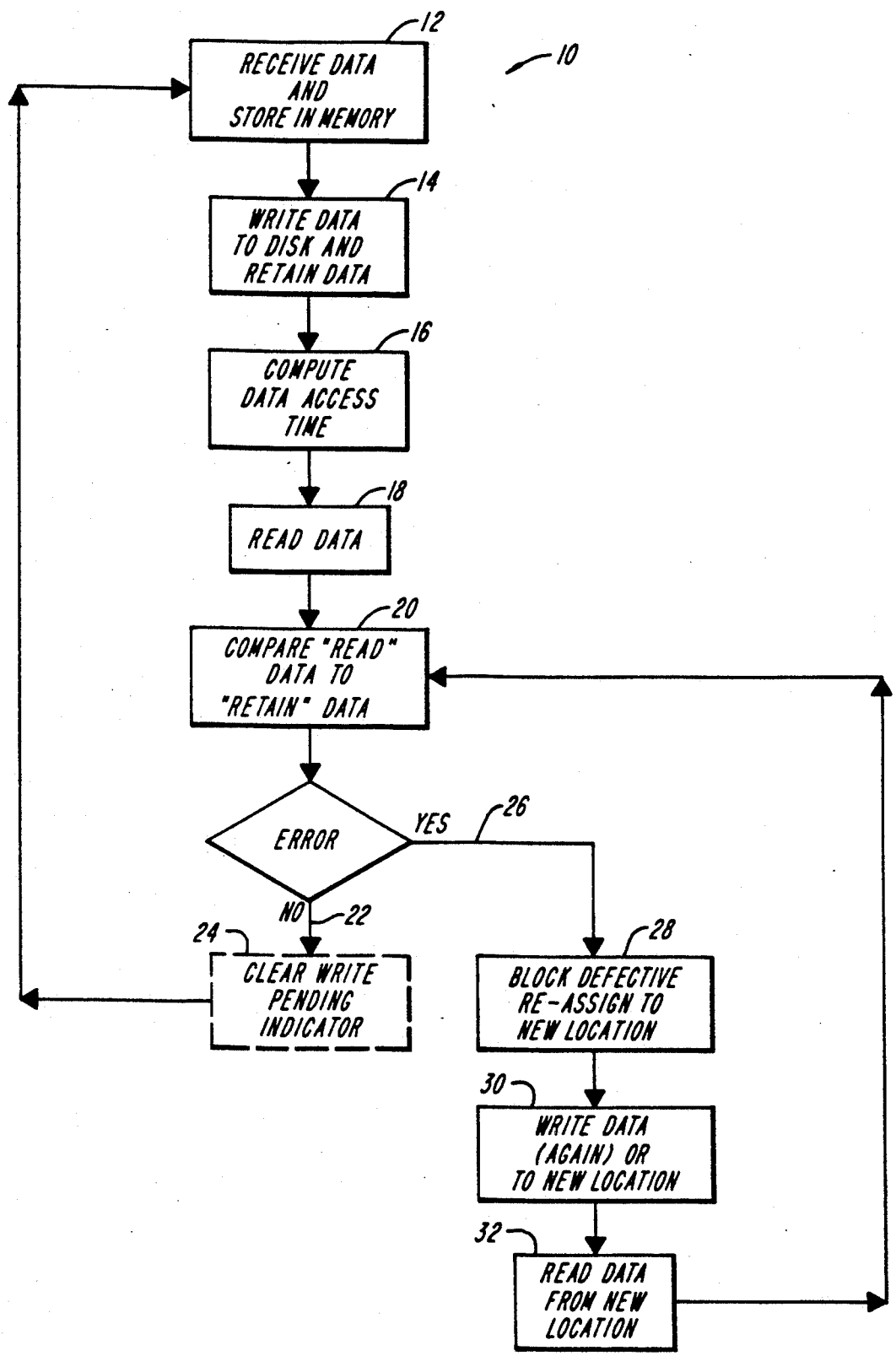
FIG. 1 is a flow chart illustrating the method for assuring data integrity after writing data to a data storage device.

The method of assuring data write integrity is illustrated in conjunction with flow chart 10, FIG. 1, wherein at step 12, the method includes receiving data which is to be written to a data storage device. The data may be received directly from a host computer or other communication device, or may be received from a host interface and controller as described in greater detail in Applicants' co-pending U.S. patent application Ser. No. 07/587,253, entitled "Reconfigurable, Multi-Function Disk Controller" incorporated herein by reference. After the data is received, the data is stored in a memory storage medium such as a high-speed semiconductor memory commonly referred to as cache memory.

After the data has been received and stored in a temporary memory storage medium, the method of the present invention proceeds to write the data to the data storage device, step 14. The data that has just been written to disk is retained in at least one memory storage medium for possible future use. In a preferred embodiment, the data which awaits writing to the data storage device is retained in the high-speed semiconductor cache memory along with an associated indicator, referred to as a write pending indicator. Such a system for storing data along with an associated write pending indicator is described in greater detail in Applicants' co-pending U.S. patent application Ser. No. 07/586,254, entitled "Disk Storage System With Write Preservation During Power Failure" which is incorporated herein by reference.

Alternatively, the data may be retained within the storage device itself such as a small temporary semiconductor memory buffer within the data storage device. Additionally, the storage device controller or the storage device itself may compute an error checking and correction (ECC) code associated with each block of data. Thus, a feature of the present invention is that the data is retained in the temporary storage buffer after being written to disk until the integrity of the data which has been written to disk is verified by performing a subsequent read and compare operation with a chosen criteria as will be described below.

In the preferred embodiment, the data storage device includes a rotating data storage device such as a disk drive, CD-ROM or optical disk. Additionally, each rotating data storage device may have a backup or "mirror" device which generally contains substantially the same information as the "primary" data storage device, although the "primary" and "mirror" devices may be rotationally out of phase with each other.

In such an embodiment, the method of the present invention then proceeds to compute data access times for accessing the data which has just been previously written to both the "primary" data storage device and the "mirror" data storage device, step 16. Since the two rotational data storage device are out of phase with one another, one of the "primary" or "mirror" data storage devices will have an access time which is shorter than the other. Accordingly, the data will be read from the data storage device with the shortest computed access time, step 18. Such a system utilizing a "primary" and "mirror" rotating data storage medium with computed shortest data access time is described in greater detail in Applicants' co-pending U.S. patent application Ser. No. 07/587,026, entitled "Disk Storage System With Data Mirroring and Reduced Access Time Data Retrieval" which is incorporated herein by reference.

In one embodiment utilizing both "primary" and "mirror" data storage devices which have both been updated, the system may direct the "primary" and "mirror" device to perform a data comparison among one another on one or more blocks of data. Utilizing this method frees up the system data bus for other data transfers. If an error is detected, either the "primary" or "mirror" disk reports the error to the system. Since the original data is still stored in the temporary memory storage medium, the data is available to be re-written to either the "primary" or the "mirror" storage device as necessary.

After the data which has been previously written is read from the data storage device, the method of the present invention next proceeds to compare the data which has been read to the same data which was previously retained in at least one temporary memory storage medium, step 20. If the data which has just been read is equivalent to the data which was retained in the temporary memory storage medium, no error is encountered as shown in step 22. If, as previously described with regard to the preferred embodiment, the data was stored in the temporary memory storage medium with a write pending indicator, the method of the present invention next clears or resets this write pending indicator now that the data has been written to disk and its integrity confirmed, step 24, prior to returning to step 12 to receive and store a quantity of second data to be written to the data storage device.

If, however, the comparison performed in step 20 indicates that the data which was previously written to and most recently read from data storage device is not equivalent to the same data which was retained in a temporary memory storage medium as shown at step 26, one embodiment of the method of the present invention assumes that one or more data storage locations on the data storage device being read is defective and reassigns the data to be written to one or more new locations on the data storage device, step 28. In another embodiment of the present invention wherein the data storage device includes one or more disk drives, an entire group or block of data storage locations are considered defective if one or more of the individual data storage locations are defective and thus, this embodiment method of the present invention determines at step 28 that an entire block is defective and generates a pointer or other index from the defective block to a new physical block on the disk drive at which the data would be stored as is well known to those skilled in the art.

Subsequently, the method proceeds to write the data which is stored in the one or more temporary memory storage mediums to the new, reassigned, location on the data storage device, step 30. The data is then read from the new location on the data storage device, step 32, prior to returning to the step of comparing the data which as just been read to the data retained in at least one temporary memory storage medium, step 20. Alternatively, after detecting an error between the data which has been read and the data retained in at least one memory storage medium, step 26, one embodiment of the method of the present invention proceeds directly to step 30 wherein the data is again written to the same location on the data storage device prior to being re-read at step 32 and compared at step 20.

Thus, in accordance with one feature of the present invention, data is retained in a temporary memory storage medium after being written to a data storage device until a data write integrity verification has been performed to ensure that the data written to the data storage device does not contain any errors prior to releasing the retaining data or clearing a write pending indicator.

In yet another embodiment of the present invention, the step of comparing the data read with the chosen criteria, step 20, includes comparing an error checking and correction (ECC) code. In one implementation of this embodiment, the storage device controller may generate the ECC code and transmit it along with the data to the storage device. The storage device then writes the data on the storage device and retains the ECC code in its internal memory. To perform data verification, the storage device then reads the data previously stored on the device and computes the ECC code for the newly read data. The data storage device then compares the ECC code it has generated on the read data with the ECC code generated by the storage device controller and now stored in the storage device memory. Any errors may then be reported to the storage device controller which can retrieve the data from the temporary memory storage unit thus providing full data write integrity. This implementation frees up the system data bus to perform other data transfers by imposing upon the storage device itself the task of verifying data write integrity.

In a modified implementation of the embodiment utilizing the ECC code, the storage controller may transfer the data without an ECC code to the storage device. Upon receiving the data, the storage device computes a first ECC code on the data and stores this ECC code in its internal memory. The storage device then writes the data on the storage device medium. To perform data write integrity verification, the storage device then reads the previously written data and generates a second ECC code. The storage device then compares the first ECC code generated when the data was received with the second ECC code generated when the data was read from the storage medium. Although this implementation provides somewhat less protection than the previous implementation described above, it assures that what was received by the storage device is properly written to disk and increases the throughput of the system by reducing the burden on the storage device controller.

Figure 2:
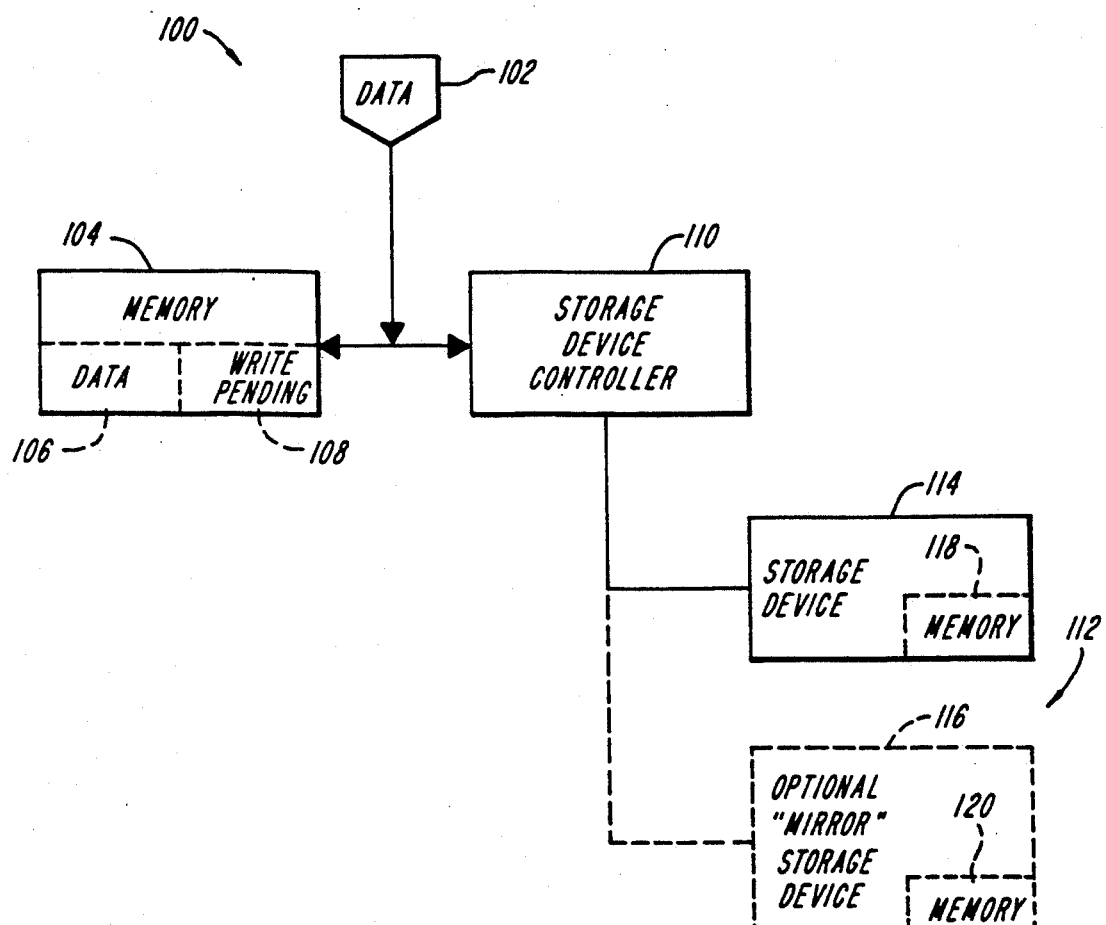
FIG. 2 is a schematic block diagram of an exemplary system for performing the method of the present invention.

The method of the present invention may be practiced in conjunction with the system illustrated in block diagram 100, FIG. 2, wherein data 102 is received from a host computer or a host computer interface and controller. The data is then stored in a temporary memory storage medium 104 such as a high-speed semiconductor cache memory. In one embodiment, the data portion 106 is stored with an associated write pending portion 108 to indicate that the associated data is awaiting being written to the storage device.

At the appropriate time, such as when a storage device controller 110 is not receiving requests for access to one or more connected storage devices, the storage device controller 110 searches temporary memory storage medium 104 for data 106 with an associated write pending indicator 108. The storage device controller then performs a write command to one or more storage devices 112. The storage devices may include a "primary" storage device 114 and a "mirror" storage device 116. Additionally, storage devices 112 may include a small temporary memory buffer 118,120 within which data which has been written to the storage device is stored.

The storage device controller 110 then performs a "read" operation from one or more storage devices 112 after having computed the shortest data access time in the case where the optional "mirror" storage device 116 is utilized. Storage device controller 110 then compares the data which has been read with either the identical data stored in memory 104 or with the two ECC codes which are generated for the data, the first ECC code having been generated prior to writing the data to a storage device, and the second ECC code having been generated when the data was read from the data storage device.

If no error is detected, the next data or quantity of data is transferred from memory 104 to one or more storage devices 112 during a subsequent write operation. If an error is detected, storage device controller 110 directs one or more storage devices 112 to either rewrite data stored in memory 104 or storage device buffers 118,120 to the same location on the storage device, or determines that one or more storage device locations are defective, and reassigns defective locations to new locations prior to rewriting, re-reading and re-comparing the data as previously described.

Modifications and substitutions to the present invention by one of ordinary skill in the art are considered to be within the scope of the present invention, which is not to be limited except by the claims which follow.

We claim:

1. A method for assuring data write integrity for received data which is to be written to at least one data storage device, comprising the steps of:
   storing said received data in at least one temporary memory storage medium, and setting an associated right pending indicator for said received data in said temporary memory storage medium, said right pending indicator indicating that the associated received data is to be written to at least one data storage device;
   writing said received and stored data to selected storage locations on said at least one data storage device;
   retaining said received data and said set, associated right pending indicator in said at least one temporary memory storage medium;
   reading said received data written to said at least one data storage device;
   comparing said recited data read from said at least one data storage device with said received data stored in said at least one memory storage medium;
   determining if said received data read from said at least one data storage device is equivalent to said received data stored in said at least one temporary memory storage medium;
   and
   if said received data read from said at least one data storage device is equivalent to said received data stored in said at least one temporary memory storage medium, performing the steps of,
   resetting said associated right pending indicator set in said temporary memory storage medium, and returning to the step of receiving data;
   if said received data read from said at least one data storage device is not equivalent to said received data stored in said at least one temporary memory storage medium, performing the steps of,
   re-writing said received and stored data from said at least one temporary memory storage medium to selected storage location on said at least one data storage device, and
   returning to the steps of reading, comparing, and determining for said received data written to said selected storage locations on said at least one data storage device.

2. The method of claim 1 wherein said received data includes one byte of data.

3. The method of claim 1 wherein said received data includes a plurality of bytes of data corresponding to a block of storage locations on said at least one data storage device.

4. The method of claim 1 wherein said temporary memory storage device includes semiconductor memory.

5. The method of claim 4 wherein said semiconductor memory is operative as a cache memory.

6. The method of claim 1 wherein said step of writing received data to said at least one data storage device includes writing said received data to two data storage devices.

7. The method of claim 6 wherein said two data storage devices include two rotational data storage devices.

8. The method of claim 7 wherein said rotational storage devices include disk drives.

9. The method of claim 7 wherein said two rotational storage devices include optically encoded disks.

10. The method of claim 7 wherein said two rotational storage devices include CD ROM disks.

11. The method of claim 1 wherein the step of retaining said received data includes retaining said received data in said temporary memory storage medium and in said at least one data storage device.

12. The method of claim 7 further including prior to the step of reading said received data, the step of computing first and second access times for accessing the data stored on said two rotational data storage devices, and wherein the step of reading said received data includes reading from the rotational data storage device with the shortest computed data access time.

13. The method of claim 1 further including before the step of re-writing said received data, the step of:
   determining that at least one of said selected storage locations on said at least one data storage device is defective upon the non-equivalence of said received data read from said at least one data storage deice and said received data stored in said at least one temporary memory storage medium;
   re-writing said received and stored data to different selected storage locations on said at least one data storage device; and
   repeating the steps of reading, comprising and determining, for said received data written to said different selected storage locations on said at least one data storage device.

14. A method for assuring data write integrity for received data which is to be written to at least one data storage device, comprising the steps of:
   storing said received data in at least one temporary memory storage medium, and setting an associated right pending indicator and for said received data in said temporary memory storage medium, said right pending indicator indicating that the associated data is to be written to at least one data storage device;

writing said received and stored data to selected storage locations on said at least one data storage device;

retaining said received data in said at least one temporary memory storage medium;

reading said received data written to said at least one data storage device;

comparing said received data read from said at least one data storage device with at least one selected criteria;

determining if said received data read from said at least one data storage divide is equivalent to said selected criteria;

if said received data read from said at least one data storage device is equivalent to said selected criteria, performing the steps of:

re-setting said associated right pending indicator set in said temporary memory storage medium, and returning to the step of receiving data; if said received data read from said at least one data storage device is not equivalent to said selected criteria, performing the steps of:

re-writing said received and stored data from said at least one temporary memory storage medium to the selected storage locations on said at least one data storage device; and returning to the steps of reading, comparing and determining, for said received data written to said selected storage locations on said at least one data storage device.

15. The method of claim 14 wherein said selected criteria includes an error checking and correction code.

16. The method of claim 15 wherein the step of writing said received and stored data to selected storage locations on said at least one data storage device further includes the step of generating said error checking and correction code and storing said error checking and correction code in said temporary memory storage medium.

17. The method of claim 16 wherein the step of generating said error checking and correction code is performed by a storage device controller.

18. The method of claim 16 wherein said step of generating said error checking and correction code is performed by said at least one data storage device.

19. The method of claim 16 wherein the step of reading said received data written to said at least one data storage device further includes generating an error checking and correction code on said received data read from said at least one data storage device, and wherein the step of comparing includes comparing said error checking and correction code generated on said received data read from said at least one data a storage device with said error checking and correction code generated on said received data written to said at least one data storage device and stored in said temporary memory storage medium.

* * * * *